United States Patent
Pelletier et al.

(10) Patent No.: US 7,512,716 B2
(45) Date of Patent: Mar. 31, 2009

(54) HEADER COMPRESSION METHOD

(75) Inventors: Ghyslain Pelletier, Lulea (SE); Lars-Erik Jonsson, Lulea (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 1079 days.

(21) Appl. No.: 10/673,345

(22) Filed: Sep. 30, 2003

(65) Prior Publication Data
US 2004/0073711 A1    Apr. 15, 2004

(51) Int. Cl.
*G06F 15/16* (2006.01)
(52) U.S. Cl. ...................... 709/247; 709/236
(58) Field of Classification Search ............... 709/247, 709/236
See application file for complete search history.

(56) References Cited

U.S. PATENT DOCUMENTS

| | | | | |
|---|---|---|---|---|
| 5,131,016 | A * | 7/1992 | Broughton et al. | 375/240 |
| 5,535,199 | A * | 7/1996 | Amri et al. | 370/392 |
| 5,546,395 | A * | 8/1996 | Sharma et al. | 370/468 |
| 6,608,841 | B1 * | 8/2003 | Koodli | 370/474 |
| 6,889,261 | B2 * | 5/2005 | Hata et al. | 709/247 |
| 7,069,495 | B2 * | 6/2006 | Soderberg et al. | 714/776 |
| 7,290,063 | B2 * | 10/2007 | Kalliokulju et al. | 709/247 |
| 2002/0059464 | A1 * | 5/2002 | Hata et al. | 709/247 |
| 2002/0071432 | A1 * | 6/2002 | Soderberg et al. | 370/389 |
| 2002/0097723 | A1 * | 7/2002 | Tourunen et al. | 370/392 |
| 2004/0042507 | A1 * | 3/2004 | Pelletier et al. | 370/521 |
| 2005/0195750 | A1 * | 9/2005 | Le et al. | 370/252 |
| 2007/0160059 | A1 * | 7/2007 | Poeluev et al. | 370/395.3 |

FOREIGN PATENT DOCUMENTS

| | | |
|---|---|---|
| EP | 1 180 871 A2 | 2/2002 |
| WO | 02/25895 A1 | 3/2002 |
| WO | 02/33931 A1 | 4/2002 |

OTHER PUBLICATIONS

Pelletier: "Mode Transitions" (Online) Jun. 18, 2003.
International Search Report mailed Dec. 8, 2003 in corresponding PCT application No. PCT/SE03/01448.

* cited by examiner

*Primary Examiner*—Douglas B Blair
(74) *Attorney, Agent, or Firm*—Nixon & Vanderhye, P.C.

(57) ABSTRACT

The invention relates to header compression in packet-based communication systems. A mechanism that allows a compressor to reject a request for an undesirable mode change is proposed. The compressor indicates to the decompressor that the mode change request is being ignored, whereafter the decompressor may abort the initiated mode transition, with the understanding that the compressor has valid reasons to refuse it. The compressor preferably determines whether the rejection succeeded by link monitoring, and in case of a successful rejection, the compressor remains in its current mode. A preferred embodiment performs explicit rejection signaling through a mode change rejection message with a redefined mode value. The rejection signaling of the invention makes it possible for a compressor to disable the transition to a particular mode and enables implementations with only a subset of all modes.

33 Claims, 4 Drawing Sheets

HEADER COMPRESSION METHOD

TECHNICAL FIELD

The present invention generally relates to packet-based communication systems and in particular to a method and means for header compression.

BACKGROUND

Due to the tremendous success of the Internet, it has become a challenging task to make use of the Internet Protocol (IP) over all kinds of links. However, this is especially difficult for narrow band links such as cellular links, since the headers of IP protocol packets in general are rather large compared to the data (payload). For example, when ordinary speech data is transported by the protocols used for Voice-over-IP (VoIP), the header often represents as much as 70% of the packet, which results in a most inefficient link usage.

Header compression refers to techniques for minimizing the necessary bandwidth for information carried in headers on a per-hop basis over point-to-point links. There are several header compression protocols, including RFC 1144 [1], RFC 2507 [2] and RFC 2508 [3]. The principles of header compression take advantage of the fact that some header fields are not changing within a flow, or alternatively change with small or predictable values. These characteristics are used by the header compression schemes, which send static information only initially, while changing fields are sent with their absolute values or as differences from packet to packet. Completely random information has to be sent without any compression at all.

Header compression is an important component to make VoIP over Wireless (VoIPoW) an economically feasible alternative to circuit switched voice, and for this purpose solutions for Robust Header Compression (ROHC) have been developed. ROHC, as defined in RFC 3095 [4], is an extensible framework for which profiles for compression of various protocols can be defined. For VoIP, the application data is transported end-to-end within an IP/User Datagram Protocol (UDP)/Real-time Transport Protocol (RTP) stream. Header compression of IP/UDP/RTP is defined by the ROHC profile 0x0001 (ROHC RTP) and is applicable for VoIP services among others. The ROHC RTP header compression scheme has been designed to efficiently compress headers over an arbitrary link layer. Most functionality is handled by the ROHC RTP scheme itself and, except for negotiation, only framing and error detection need to be provided by the link layer.

ROHC has three different modes of operation, which, for a specific context, control the actions and the logic to perform as well as the packet types to use during different states of the header compression operation. Allowed packet types and formats may vary from one mode to another. The Unidirectional mode (U-mode) is used at the beginning of any ROHC compression before transition to another mode may occur. The Bidirectional Optimistic mode (O-mode) aims to maximize the compression efficiency and is associated with sparse usage of the feedback channel. The Bidirectional Reliable mode (R-mode) aims to maximize robustness against loss and context damage propagation.

When in U-mode, packets are sent from compressor to decompressor only; this mode is thus usable over links where a return path from decompressor to compressor is either not desired or not available, and periodical refreshes are used in this mode. The 0-mode is similar to the U-mode with the difference that a feedback channel is used to send error recovery requests and (optionally) acknowledgements of significant context updates from the decompressor to compressor. The U-mode and the 0-mode are often together referred to as the U/0-mode due to the very similar nature thereof. The R-mode is significantly different from the two other modes, mainly by a more extensive usage of the feedback channel and a stricter logic for performing context updates. The R-Mode also uses a few different packet types only understood and useful in this mode.

Each mode of operation has different properties in terms of compression efficiency, robustness and processing complexity. ROHC does not specify how and when the respective modes should be used (except that ROHC compression must always start in U-mode), whereby the logic for mode transitions becomes an implementation issue. Mode transitions may only be initiated by the decompressor, and according to the current specification for Robust Header Compression (RFC3095) every ROHC implementation must support all modes of operation.

The above characteristics and requirements of prior-art header compression schemes are associated with a number of drawbacks.

Header compression vendors are likely to optimize their compressor implementations for specific modes of operation, e.g. in order to minimize the memory requirements or the required processing power. However, there is no guarantee that a particular implementation will actually be used in its preferred mode. Instead it may be forced into sub-optimal operation, resulting in reduced compression efficiency and link performance.

Another problem is that a lot of functionality is needed for a ROHC implementation to support all compression modes. Considerable implementation, validation and testing actions have to be performed, which in turn implies relatively long implementation times and high implementation costs. All modes may not necessarily be useful in a specific environment. Furthermore, in order to minimize the program footprint and/or the time required to build an interoperable ROHC algorithm implementation, it would sometimes be desirable to only support the mode(s) consistent with the deployment strategy of a particular implementer.

Accordingly, the header compression of conventional telecommunication systems is far from satisfactory and there is a considerable need for an improved header compression method, in particular one that offers compression mode flexibility.

SUMMARY

A general object of the present technology is to achieve more efficient header compression. A specific object is to provide mechanisms for flexible header compression with regard to compression modes. Another object is to enable easily implemented header compression schemes.

Briefly, the present technology achieves more efficient header compression by means of a mechanism that allows a compressor to reject a request from a decompressor for an undesirable mode change. According to the proposed method, the compressor indicates, preferably by implicit or explicit signaling, towards the decompressor that the mode change request is being rejected/ignored. In response to this indication the decompressor may thereafter abort the initiated transition, with the understanding that the compressor has valid reasons to refuse the mode transition. If the decompressor is aware of the indicated rejection, it responds by a rejection acknowledgement action, implying a successful rejection. The rejection acknowledgement action can for instance involve decreased retransmission frequency or ceased retransmission of the mode change request, or an explicit rejection acknowledgement message. The compressor preferably determines whether the rejection was successful by monitoring and interpreting the decompressor signaling behavior and in case of a successful rejection the compressor remains in its current mode.

Preferred embodiments of the technology achieves explicit rejection signaling by sending a mode change rejection message with a redefined mode value from the compressor to the decompressor, and implicit rejection signaling by intentionally ignoring the requests for a predetermined period of time. There may also be embodiments with combined explicit and implicit rejection signaling.

Thus, by means of the messaging method according to the present technology a header compressor can either safely ignore a request from the decompressor or explicitly signal rejection of the mode change request. This makes it possible for the compressor to disable the transition to a particular mode if preferred considering different factors, including some unknown to the decompressor. It also enables compressor implementations that only support a subset of all operation modes for header compression. In particular, advantageous U/O-mode only implementations that are consistent with the ROHC specifications can be provided.

According to other aspects of the technology, a communication system and a header compressor unit are provided.

Header compression in accordance with the present technology offers the following advantages:
  improved header compression efficiency
  efficient use of available bandwidth
  reduced implementation footprint
  reduced memory requirements
  less functionality to implement, validate and test
  improved implementation time and cost
  more easily deployable ROHC products
  widespread mode-specific (e.g. U/O) implementations.

BRIEF DESCRIPTION OF THE DRAWINGS

The invention, together with further objects and advantages thereof, is best understood by making reference to the following description and the accompanying drawings, in which.

DETAILED DESCRIPTION

Figure 1:
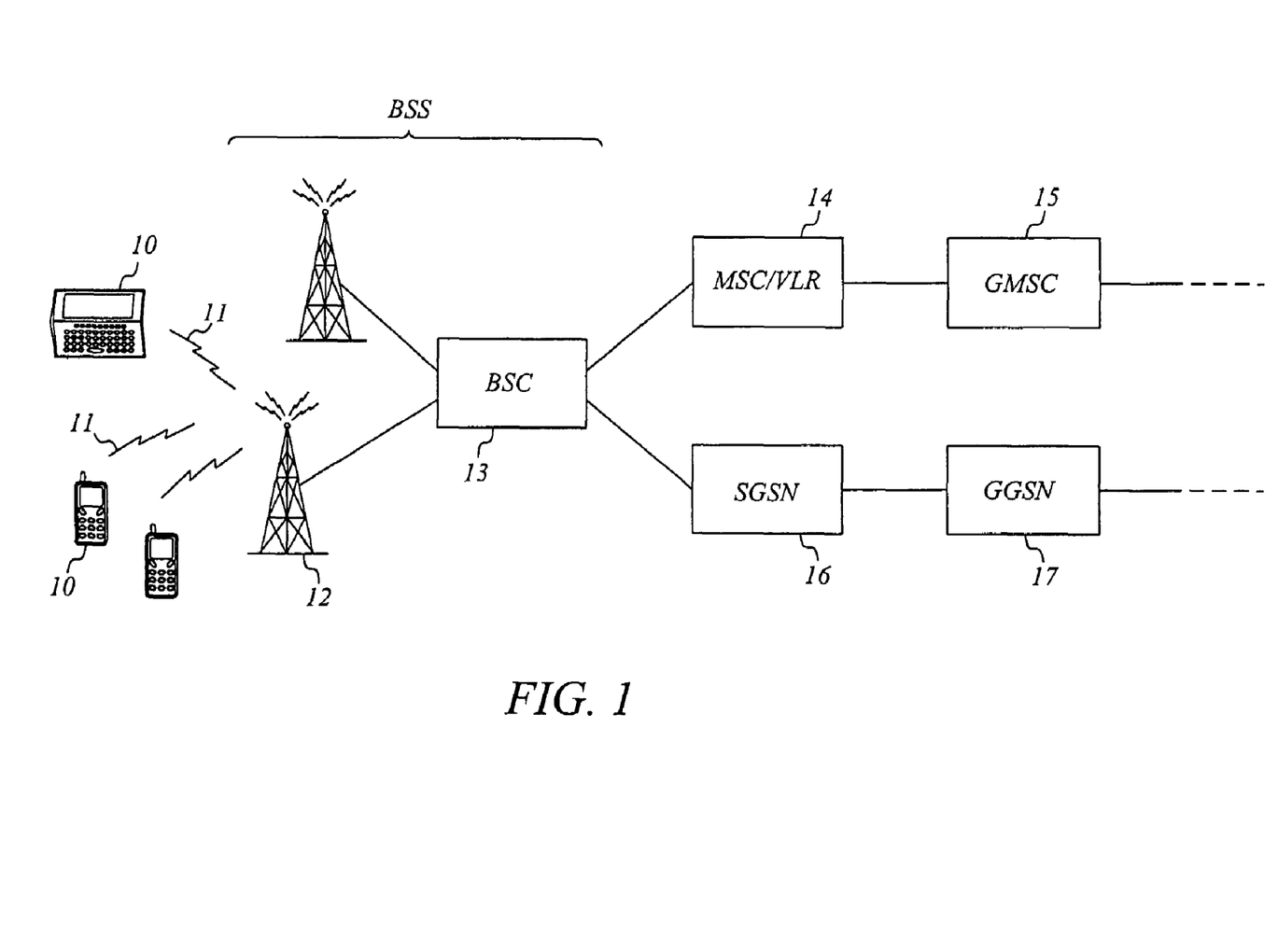
FIG. 1 is a schematic block diagram illustrating an exemplary communication network, in which the present technology can be used.

FIG. 1 is a schematic block diagram illustrating an exemplary Global System for Mobile communication/General Packet Radio Service (GSM/GPRS) communication network, in which the present technology can be used. A radio network comprising a number of mobile stations/terminals 10, such as mobile phones, laptops and wireless relays, communicating with a Base Station Subsystem (BSS) over wireless links 11 is shown. The BSS typically comprises a large number of Base Transceiver Stations (BTS) 12 and Base Station Controllers (BSC) 13. Each BTS serves the mobile terminals within its respective coverage area and several BTS are controlled by a BSC, which in turn provides access to the core network, comprising a Mobile Switching Center (MSC) 14 and a Gateway Mobile Switching Center (GMSC) 15. GSM traffic is routed through the MSC 14, which is associated with a Visitor Location Register (VLR) responsible for the current location of a mobile terminal 10. Communication to and from external networks is handled by the GMSC 15. The packet-switched subnetwork comprises a Serving GPRS Support Node (SGSN) 16 and a Gateway GPRS Support Node (GGSN) 17. GGSN acts as an interface towards external packet data networks, while SGSN is responsible for packet delivery to and from terminals within its ice area.

In practice, most networks comprise multiple network nodes arranged in much more complex ways than in the basic example of FIG. 1. Moreover, FIG. 1 is an example of one type of communication system in which the present technology may be used. The technology is also applicable on other packet data communication networks, including e.g. cdma2000 wireless packet data communication networks as well as systems using other radio technologies for wireless IP such as Wlan.

Header compression is typically used to reduce the required bandwidth of one or more links in the illustrated communication network and thereby improve its transmission efficiency and speed. In particular, wireless communication often requires such bandwidth reduction, but header compression can be useful for other links as well, including static/wired links. Generally, there is both a compressor and a decompressor on each end of a link where header compression is applied. In a wireless system these are often located in the mobile station 10 for the terminal end of the link 11 but could also be located e.g. on each side of a transceiver and receiver used as a relay. At the network side of the link 11 the compressor and decompressor can be arranged in one or more of the following nodes: a SGSN 16 or GGSN 17 for a GPRS-based packet data system, a Packet Data Serving Node (PDSN) (not shown) for a cdma2000 packet data system, or in the base station 12 or another node of the radio access network.

Figure 2:
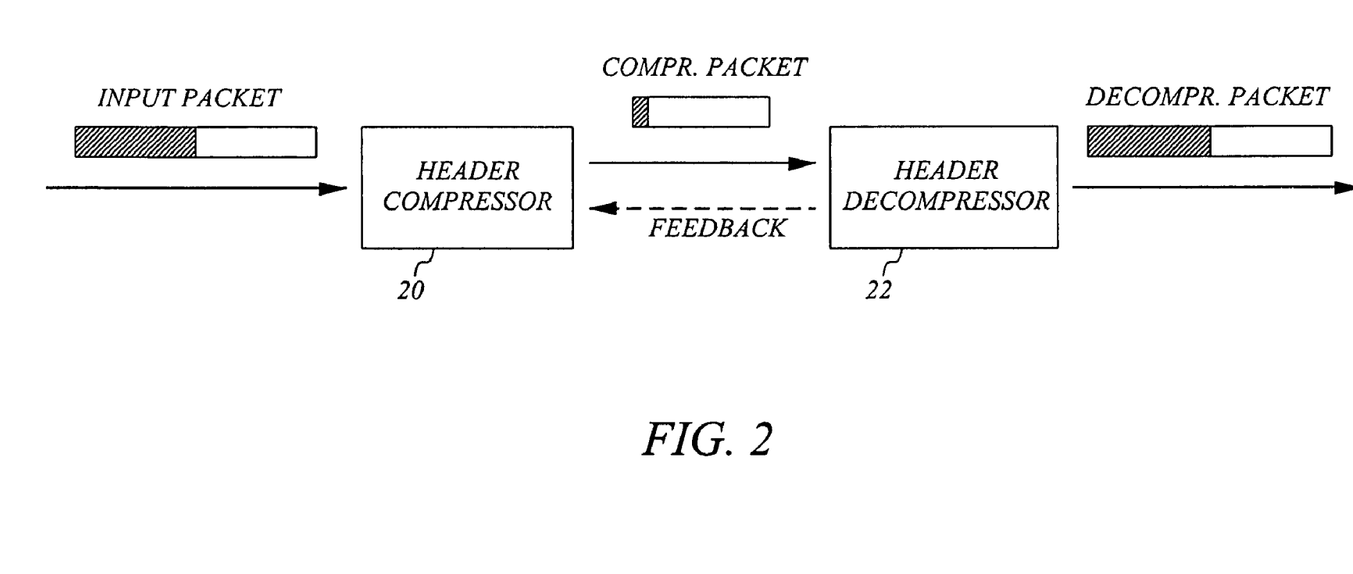
FIG. 2 illustrates a header compression mechanism, in which the present technology can be used.

In FIG. 2, the general principle of header compression is illustrated. A header compressor unit 20 and a header decompressor unit 22 are shown. These units 20, 22 communicate over a link with a forward channel (from compressor to decompressor) as well as an optional feedback channel. Besides the actual data/payload, each IP packet input to the header compressor unit comprises a header portion (in FIG. 2 represented by a striped field) with source and destination addresses, error checking, port and protocol fields, etc. The header portion often constitutes a larger portion of the packet than the data. Forwarding the complete packet would thus require large bandwidth and therefore the packet is compressed by eliminating redundant header information in the header compressor unit 20 before being transferred over the bandwidth-limited link (11 in FIG. 1). The header decompressor unit 22 reconstructs the packet into a decompressed packet substantially identical to the original input packet.

Header compression basically relies on the recognition that many header fields of packets belonging to the same stream are constant or rarely changing, and full header fields therefore only have to be sent occasionally. Details and rules on header compression are provided in several header compressor protocols. In this disclosure focus will for exemplary purposes mainly lie on ROHC, but even though the present invention is very useful in conjunction with ROHC, and in particular the ROHC RTP, UDP and ESP profiles (RFC3095 [4]), the ROHC UDP-Lite profile [5], the ROHC IP-Only profile [6], the LLA profile (RFC 3242 [7]) as well as the R-mode extension to the LLA profile [8], it is in no way restricted thereto. Other current or future header compression schemes, ROHC or not, also lie within the scope of the invention.

As indicated in the background section, the specification for Robust Header Compression (RFC3095) states that "All ROHC implementations MUST implement and support all three modes of operation". The mode transitions are to be performed as follows.

From U-mode to O-mode

If a feedback channel is available, the decompressor may decide to initiate a mode transition from U-mode to O-mode, by sending a feedback packet carrying a request for a mode change to O-mode. The decompressor is allowed to already transit to O-mode, as the packet types used for both U- and O-modes are the same. The compressor will transit to O-mode as soon as the request is received.

From O-mode to R-mode

The decompressor may initiate a mode transition from O-mode to R-mode by sending a request to the compressor. Once the transition is initiated, the compressor is not allowed to use any of the packet types using a common identifier but for which the interpretation between U/O-mode and R-mode differs, typically the most efficient packet formats. Until the decompressor receives a confirmation from the compressor regarding the mode change, the decompressor will keep sending this mode request for every packet received from the compressor. The compressor uses the "mode" field of specific packet types allowed during a transition, and sets it to the requested mode to confirm the change. The 2-bits mode field semantics are defined as:

Compression mode 0=Reserved
   1=Unidirectional (U-mode)
   2=Bidirectional Optimistic (O-mode)
   3=Bidirectional Reliable (R-mode)

From U-mode to R-mode

Same procedure as from O-mode to R-mode

From R-mode to O-mode

Same procedure as from O-mode to R-mode.

A transition back to U-mode is also always possible.

According to ROHC (RFC 3095), the compression process must start in the U-mode. The U-mode and the O-mode are in practice very similar to each other, and therefore both are readily supported. As the R-mode is significantly different from the two others modes, it would in many cases be convenient to leave out the R-mode and use U/O-mode only implementations.

It is evident that flexible mode implementations of ROHC, such as U/O-mode only implementations, that enable optimized header compressors with less functionality to implement would be very advantageous. Many compressors would sometimes prefer not to transit to another mode, e.g. the R-mode, even when requested by the decompressor. It can also be desirable to avoid implementing support for particular mode(s), e.g. the R-mode, and still safely conform to the ROHC specifications.

However, ROHC does not allow the possibility to create U/O-mode only implementations and the like. As per [4], it is the decompressor only that dictates the mode transitions. This in turn puts a requirement towards the compressor implementation to always support all defined modes. A compressor may thus be forced into a sub-optimal operation simply because a decompressor implementation from a different source may favor a different mode than the one for which the compressor was optimized.

The present technology aims at offering a solution that removes the restriction placed by the ROHC algorithm towards the compressor implementations to always and absolutely support all modes of operation even when it may be needed or desirable to support only a subset.

A first thought would be to simply ignore the mode change request from the decompressor. However, for the mode transition from U- or O-mode to R-mode, for example, the current ROHC specifications reads "While D_TRANS is I, the decompressor sends a NACK or ACK carrying a CRC option for each received packet." In other words, when the decompressor has sent a mode request, the decompressor sends the request again for every packet received until it receives a mode change confirmation from the compressor. Furthermore, it is also stated that "As long as the decompressor has not received an UOR-2, IR-DYN, or IR packet with the mode transition parameter set to R, it must stay in Optimistic mode." This means that the decompressor is not allowed to change mode (e.g. to the R-mode) before it receives a mode change confirmation from the compressor. A consequence of this is that decompression safely can continue until the compressor actually performs the mode transition and confirms the request.

Since the ROHC decompressor must stay in U/O-mode until a confirmation of the mode change is received from the compressor, a compressor implementation that ignores the mode change request to R-mode from the decompressor will not stop the decompressor from continuing to perform robust decompression. Nevertheless, it will produce an increase on the feedback channel due to retransmissions of the request by the decompressor, leading to a non-optimal use of the bandwidth. Depending on the decompressor implementation, this behavior may be persistent, intermittent or transient. Thus, simply ignoring a mode change request to R-mode from the decompressor suffer the drawback of generating an increased amount of traffic over the feedback channel in a less controlled manner and for an unspecified time.

Instead, the present technology proposes a messaging procedure in which the compressor can indicate towards the decompressor that a mode change request is being rejected. In response to this indicated rejection, the decompressor may then abort the initiated transition with the understanding that the compressor has valid reasons to refuse the mode transition. Such reasons can for instance be that the compressor has better knowledge of the link conditions, that the compressor is optimized for the current mode of operation, and/or that the requested mode is not available.

According to the proposed method, a compressor that has received a request for an unwanted mode change thus indicates rejection of the mode change request to the decompressor, typically through explicit or implicit signaling. If the decompressor is aware of the indicated rejection, it responds by acknowledging the rejection e.g. through changed signaling behavior and/or an explicit message. Such a rejection acknowledgement action is interpreted as a successful rejection by the compressor, which remains in its current mode.

The present technology thus allows a compressor to either implicitly or explicitly reject a mode change request from a decompressor. This makes it possible for the compressor to disable the transition to a particular mode and even removes the need for compressors to implement all modes of operation.

To illustrate the principles of the technology, a first and a second embodiment thereof will now be described with reference to FIGS. 3 and 4. The examples mainly address mode transition from U- or O-mode to R-mode and are based on the above-described compressor behavior when initiating a mode transition request. However, embodiments with other mode change requests (concerning ROHC modes as well as other header compression modes of operation) also lies within the scope of the technology. Any request for a mode transition from a first header compression mode to a second header compression mode can thus be handled in accordance with the technology, for example a request to/from modes selected from the group of a unidirectional (U) mode, a bidirectional optimistic (O) mode, a bidirectional reliable (R) mode and a bidirectional (B) mode.

Explicit Rejection Signaling

In accordance with a first approach, the compressor explicitly signals to the decompressor that the mode change request will be ignored/rejected. The decompressor can then use this signal to abort the initiated transition, remain in U/O-mode and stop sending mode change requests.

A preferred embodiment uses redefined mode bits to explicitly signal rejection of the mode change request. As noted earlier, the mode value is in ROHC (RFC3095) defined as:

Compression mode 0=Reserved
   1=Unidirectional (U-mode)
   2=Bidirectional Optimistic (O-mode)
   3=Bidirectional Reliable (R-mode)

The mode value of the UOR-2, IR-DYN or IR packet from ROHC (RFC3095) is according to this approach redefined as:

Compression mode 0=Mode Change Request Ignored/Cancelled
   1=Unidirectional (U-mode)
   2=Bidirectional Optimistic (O-mode)
   3=Bidirectional Reliable (R-mode)

The value 0, which previously was reserved (i.e. had no particular meaning in the sense that all bits with value 0 were to be ignored), is consequently used to indicate that the mode change request is rejected/ignored by the header compressor unit. Accordingly, the compressor sends a packet with mode value 0 to the decompressor in response to an unwanted mode change request. Provided that the decompressor is aware of the new mode definitions, it can take appropriate actions, such as aborting further request transmissions. For other implementations to be aware of the signal some standardization effort may be required.

It is to be understood that the present technology also covers embodiments using other mechanisms for explicitly signaling (in-band or out-of-band) to a decompressor that a mode change request will be ignored. Thus, instead of the preferred ROHC mode value redefinition, other bits/values can be used for the explicit signaling, including a special packet type, another bit flag than the mode bit, an option within the packet format, an option within an extension, etc.

Figure 3:
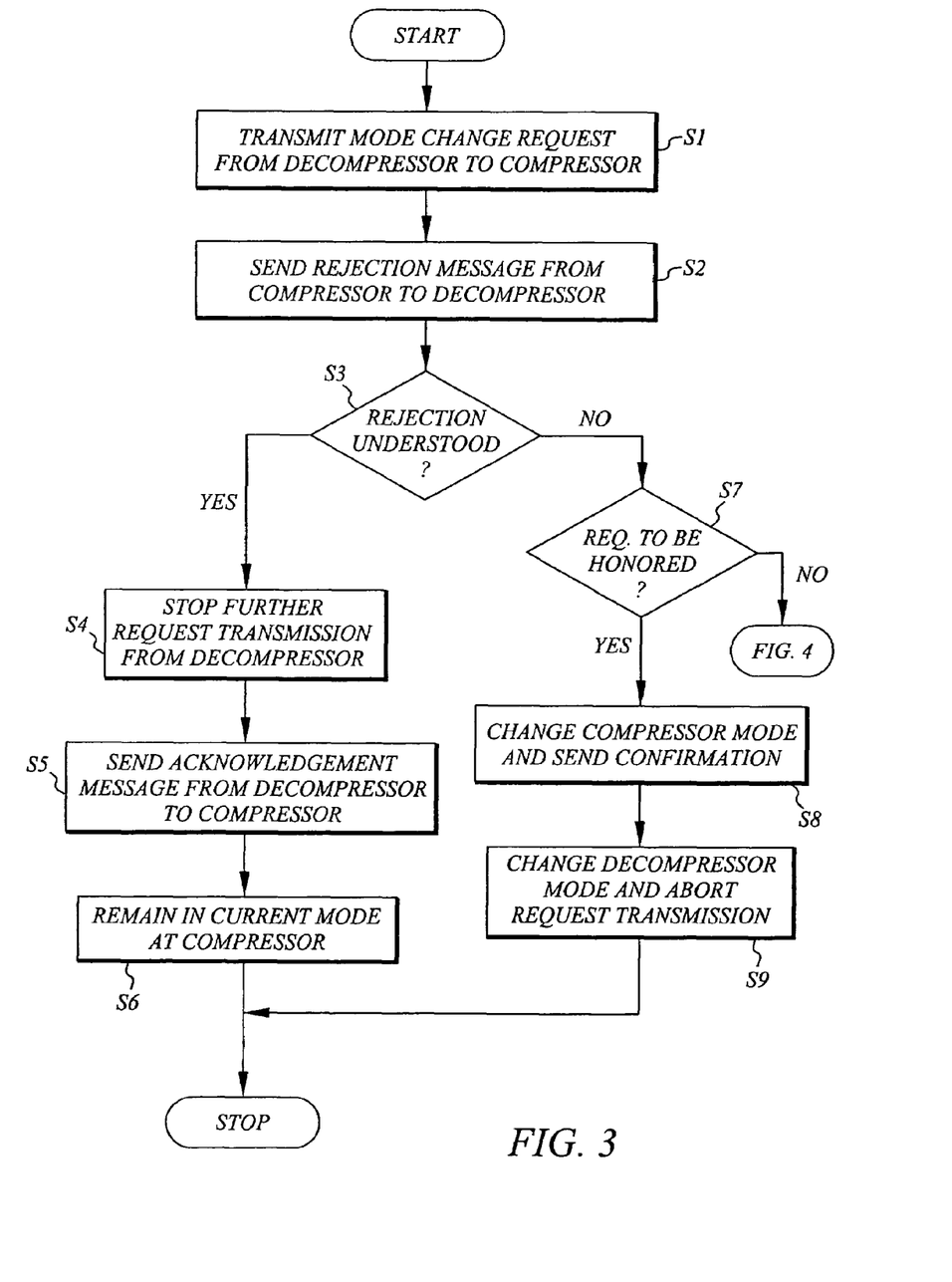
FIG. 3 is a flow chart of a header compression method according to a first exemplary embodiment.

FIG. 3 is a flow chart of a header compression method according to an exemplary embodiment of the present technology with explicit rejection signaling. In step S1, the header decompressor unit initiates a mode transition and transmits a request for a change to a new mode to the header compressor unit over the packet transfer link. In case the mode transition involves a change to the R-mode, for example, the compression mode of the request is set to MODE=3 (R-mode). The decompressor then stays in its current mode and waits for a confirmation from the compressor. For each packet received until the confirmation, the decompressor resends the request over the feedback channel.

The compressor receives the mode change request, but prefers to stay in the current mode of operation. It explicitly signals rejection of the mode change request to the decompressor, preferably by sending a mode change rejection message over the packet transfer link (step S2). In the preferred embodiment using the above redefinition of the mode value of the ROHC packets, the compressor sends one or more UOR-2, IR-DYN, or IR packet and sets MODE=0 (Request Cancelled).

Now, the procedure takes different paths depending on whether the decompressor understands the rejection of the mode change request as it receives MODE=0 packets or other explicit signals (step S3). If the decompressor is aware of the rejection signal, e.g. the newly defined semantics of the mode value, it stops sending the mode change request over the feedback channel in step S4. The mode transition is then aborted and the decompressor continues in the current mode of operation. Preferably, the decompressor also sends a message to the compressor, indicating that the rejection is acknowledged (step S5). Such a rejection acknowledgement message can for instance comprise return ROHC packets with the MODE parameter set either to 0 or to the value of the mode active at the time when the decompressor initiated the request for a mode change, i.e. the ("first"/"current") mode that the compressor wants to keep.

The compressor preferably determines whether the rejection was successful through interpreting the signaling behavior of the decompressor. Generally, this involves monitoring the packet transfer link in search for some kind of indication that the rejection has been understood and acknowledged by the decompressor. This indication can be the above rejection acknowledgement message. Alternatively, the indication that the mode change request rejection was successful can comprise the compressor sop receiving mode change requests with the new mode over the feedback channel with high confidence that the signal has reached the decompressor. Sufficient certainty would normally require at least 1 link Round-Trip Time (RTT), and typically in the range of 1-2RTT. In response to a successful rejection, the compressor continues using the current mode (step S6).

If, on the other hand, the decompressor does not understand the rejection signaling, e.g. the redefined mode value, it will ignore it and remain in the current mode of operation. Decompression is typically continued and as per [4] the decompressor still waits for the confirmation from the compressor. In this case the compressor will still receive mode change requests with the new mode over the feedback channel, although being highly confident that the signal has reached the decompressor. The compressor concludes that the rejection signaling was not successful and step S7 asks whether the request is to be honored. If so, the compressor changes compressor mode and preferably returns a confirmation, such as a packet with the new mode value, to the decompressor (step S8), which consequently changes mode and aborts further request transmission (step S9). Alternatively, the request is not honored despite the unsuccessful rejection. Instead, the compressor preferably falls back to the behavior of implicit signaling that will be described below with reference to FIG. 4.

The decision in step S7 is either determined by general implementation-specific features or based on interpretation of each particular situation. If, for example, an implementation does not support the requested mode, honoring the mode is not an option and consequently all requests for this mode will be ignored. However, a compressor may also refuse a transition on a case to case basis for reasons like that the compressor side currently has low processing resources, better understanding of the link properties, etc.

The approach illustrated by FIG. 3 has the advantage of being the most efficient way for a compressor to signal to the decompressor that a mode change request will not be honored, and a decompressor able to interpret such a signal will take appropriate actions. Such a decompressor remains in the current mode and does not increase the traffic on the feedback channel by resending the mode change request.

Another advantage is that a method according to this embodiment of the technology remains interoperable and compliant to the standard when a compressor supporting all modes but preferring the U/O-modes is used together with a decompressor implementation unaware of the proposed redefinition. A decompressor that does not understand this redefinition will simply ignore this value, as per the ROHC specifications. The compressor may then resort to the implicit signaling below or honor the mode change request.

Implicit Rejection Signaling

Another approach is for a compressor to implicitly indicate rejection of the mode change request. In a preferred embodiment, the implicit signaling is achieved by deliberately ignoring the mode change request from the decompressor and staying in the current mode, but only for a limited time. In other words, it is proposed to safely ignore the request in a controlled manner in order to indicate rejection thereof to the decompressor. If the mode change requests sent over the feedback channel cease or become intermittent after a certain period of time, the compressor can stay in the current mode, e.g. U/O-mode, without a performance penalty. Otherwise, i.e. if the traffic on the feedback channel is persistent, the compressor may decide to perform the mode change and honor the mode change request.

The length of the time period during which the compressor is to ignore the mode change request(s) and await a possible reaction from the decompressor is typically in the order of 1-2 RTT. This is because the decompressor generally can expect to receive an "answer" from the compressor about 1 RTT (minimum) after sending the request. It may take longer and the RTTs of some links also vary with time. However, in most cases the predetermined time period for implicit rejection signaling can be represented by the range of 1-2 RTT.

Figure 4:
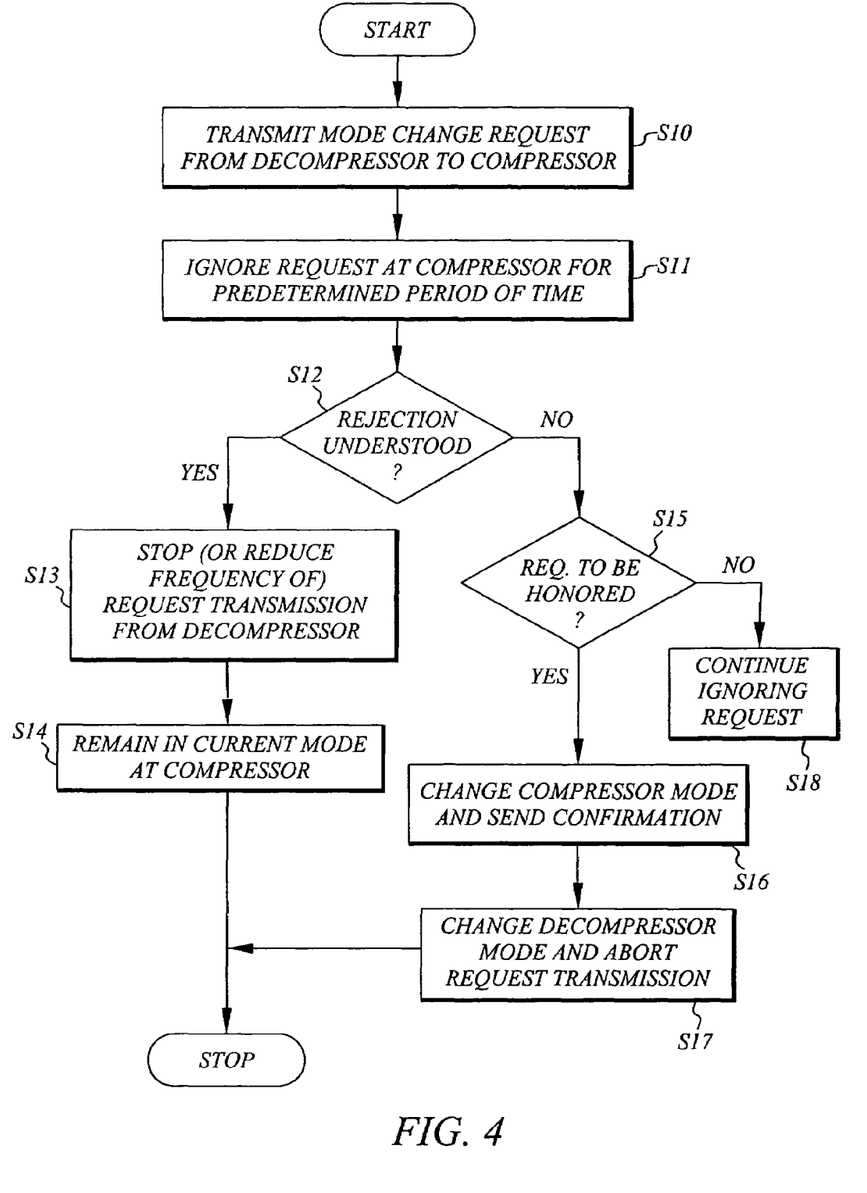
FIG. 4 is a flow chart of a header compression method according to a second exemplary embodiment.

FIG. 4 is a flow chart of a header compression method according to an exemplary embodiment of the present technology with implicit rejection. As before, the header decompressor unit initiates a mode transition and sends a mode change request to the header compressor unit (step S10). The decompressor stays in its current mode and waits for a confirmation from the compressor. For each packet received until the confirmation, the decompressor resends the request over the feedback channel.

The compressor receives the mode change request but prefers to stay in the current mode of operation. The compressor therefore indicates mode change rejection, in this case through implicit rejection signaling. Preferably it hereby ignores the request and continues in the current mode, at the same time as it starts a timer and monitors the feedback channel (step S11). The timer is set to a value for which the compressor achieves a high confidence that the decompressor can notice the lack of response to the mode change request, for example in the range of 1-2 RTT. Instead of the timer, alternative mechanisms for example based on Sequence Numbers can be used for achieving the controlled implicit rejection.

Thereafter, the procedure takes different paths depending on whether the decompressor is aware of the implicit rejection of the mode change request (step S12). If the decompressor has achieved a high confidence that the request has reached the compressor and thus that the mode change should have been performed, but still notices passivity/lack of response from the compressor, interpreted as rejection, it stops resending the mode change request over the feedback channel in step S13. Alternatively, the decompressor lowers the frequency of the mode change request transmissions. The mode transition is aborted and the decompressor remains in the current mode of operation.

As for the compressor unit, it again decides whether the rejection was successful. Preferably, this interpretation of the rejection outcome involves link monitoring and interpretation of the decompressor signaling behavior. If the compressor notices a lower frequency or absence of the mode change request transmissions over the feedback channel before the timer has expired, the rejection was successful and the compressor remains in the current mode (step S14).

Should, on the other hand, the decompressor not be aware of the rejection, the timer set by the compressor will expire without any change in the retransmissions of the mode change request over the feedback channel. The compressor interprets this behavior as an unsuccessful rejection and the procedure continues with step S15, which asks if the mode change request is to be honored. If this is the case, the compressor changes compressor mode and normally returns a confirmation, such as a packet with the new mode value, to the decompressor (step S16), which consequently changes mode and aborts further request transmission (step S17). Otherwise, the compressor continues ignoring the request and remains in the current mode (step S18). The outcome of step S15 is based on considerations similar to those for step S7 in FIG. 3. Step S18 would generally not be the preferred option but may be useful in case the compressor has not implemented the mode the decompressor is requesting.

This approach has the advantage of being interoperable and compliant to the standard. Neither does it require any change of the standard. The method illustrated in FIG. 4 may also be used as a fallback mechanism when an explicit signal is used to reject mode change requests and the decompressor does not understand the semantics of the signal sent by the compressor. However, it does lead to generation of an increased amount of traffic over the feedback channel, although in a controlled manner and for a limited period of time.

The embodiments illustrated by FIG. 3 and FIG. 4, respectively, are each associated with advantages and the choice of the most suitable method involves weighting factors like interoperability and performance against each other. The respective signaling schemes can be used separately or in combination, for instance with the implicit signaling (FIG. 4) as an additional fallback mechanism if the explicit signaling (FIG. 3) should not result in a successful rejection.

In summary, the present technology allows a header compressor to reject a mode change request from a header decompressor and continue using the current mode of operation if deemed appropriate considering different factors, including factors not known to the decompressor. It also enables compressor implementations that only support a subset of all operation modes for header compression. In particular, by means of the technology, it is possible to create efficient U/O-mode only implementations while still conforming entirely to the ROHC specification [4].

The technology removes compressor dependencies towards the decompressor with respect to mode transitions. This results in better header compression efficiency, and may also reduce the memory requirements, implementation time and implementation cost. By the explicit signaling approach especially, a more efficient use of the available bandwidth is achieved, without adverse impacts on receiver or application behavior and operation. Furthermore, the technology enables less complex and streamlined implementations of ROHC, such as implementations that only use the U- and O-modes.

Although the technology has been described with reference to specific illustrated embodiments, it should be emphasized that it also covers equivalents to the disclosed features, as well as modifications and variants obvious to a man skilled in the art. For example, even though the technology has been exemplified for ROHC (RFC3095 [4]), it may also be applied to other header compression schemes, including schemes associated with other modes of operation than the described examples. The scope of the invention is only limited by the enclosed claims.

REFERENCES

[1] Van Jacobson, *Compressing TCP/IP Headers for Low-Speed Serial Links*. IETF RFC 1144, IETF Network Working Group, February 1990.
[2] Mikael Degermark, Björn Nordgren, Stephen Pink. *IP Header Compression*. IETF RFC 2507, IETF Network Working Group, February 1999.
[3] Steven Casner, Van Jacobson. *Compressing IP/UDP/RTP Headers for Low-Speed Serial Links*. IETF RFC 2508, IETF Network Working Group, February 1999.
[4] Carsten Bormann, et.al. *RObust Header Compression (ROHC): Framework and four profiles: RTP, UDP, ESP and uncompressed*. IETF RFC 3095, April 2001.
[5] Ghyslain Pelletier. *RObust Header Compression (ROHC): Profiles for UDP-Lite*, Internet draft, April 2003. (http://www.ietf.org/internet-drafts/draft-ietf-rohc-udp-lite-00.txt)
[6] Lars-Erik Jonsson, Ghyslain Pelletier. *RObust Header Compression (ROHC): A compression profile for IP*, Internet draft, June 2003. (http://www.ietf.org/internet-drafts/draft-ietf-rohc-ip-only-02.txt)
[7] Lars-Erik Jonsson, Ghyslain Pelletier. *RObust Header Compression (ROHC): A Link-Layer Assisted ROHC Profile for IP/ UDP/RTP*. IETF RFC 3242, April 2002.
[8] Zhigang Liu, Khiem Le, *0-byte Support for R-mode in Extended Link-Layer Assisted ROHC Profile*. Internet draft, April 2002.

The invention claimed is:

1. A method for packet messaging in a communication system including a header compressor unit and a header decompressor unit, comprising the acts of
transmitting a mode change request involving a change from a first compression mode to a second compression mode from the header decompressor unit to the header compressor unit over a packet transfer link;
indicating, at the header compressor unit, rejection of the mode change request towards the header decompressor unit;
performing, if the header decompressor unit is aware of the indicated rejection, a rejection acknowledgement action at the header decompressor unit, said rejection acknowledgement action implying a successful rejection; and
remaining, at the header compressor unit, in the first compression mode in response to a successful rejection.

2. The method of claim 1, wherein indicating the rejection comprises signaling, implicitly at or explicitly from the header compressor unit, rejection of the mode change request.

3. The method of claim 2, wherein indicating the rejection comprises sending a mode change rejection message from the header compressor unit to the header decompressor unit.

4. The method of claim 3, wherein the mode change rejection message comprises a redefined mode value.

5. The method of claim 2, wherein indicating the rejection comprises ignoring, at the header compressor unit, the mode change request for a predetermined period of time.

6. The method of claim 3, wherein in case of an unsuccessful rejection by the mode change rejection message, the method further compresses rejection signaling by ignoring, at the header compressor unit, the mode change request for a predetermined period of time.

7. The method of claim 1, wherein performing the rejection acknowledgement action comprises decreasing the frequency of mode change request transmissions from the header decompressor unit in response to the indicated rejection.

8. The method of claim 1, wherein performing the rejection acknowledgement action comprises aborting further mode change request transmission from the header decompressor unit in response to the indicated rejection.

9. The method of claim 8, wherein performing the rejection acknowledgement action comprises sending a rejection acknowledgement message from the header decompressor unit to the header compressor unit (20) in response to the indicated rejection.

10. The method of claim 1, further comprising determining, at the header compression unit, whether the rejection was successful by monitoring the packet transfer link.

11. The method of claim 1, further comprising changing to the second compression mode at the header compressor unit in case of an unsuccessful overall rejection procedure.

12. The method of claim 1, wherein the header compressor unit is arranged to support only a subset of all possible compression modes.

13. The method of claim 1, wherein at least one of the header compressor unit and the header decompressor unit is implemented according to a robust header compression (ROHC) scheme.

14. The method of claim 13, wherein the first and second compression modes are selected from the group of a unidirectional (U) mode, a bidirectional optimistic (O) mode, a bidirectional reliable (R) mode and a bidirectional (B) mode, including combinations thereof.

15. The method of claim 1, wherein the act of transmitting a mode change request involving a change from a first compression mode to a second compression mode occurs after a compression process has started.

16. A communication system for packet messaging comprising.
a first network node connected to a first end of a packet transfer link;
a network node connected to a second end of the packet transfer link and which communicates with the first network node over the packet transfer link;
a header compressor unit which comprises the first network node,
a header decompressor unit which comprises the second network node and which is configured to generate a mode change request involving a change from a first compression mode to a second compression mode;
wherein the packet transfer link is configured to transmit the mode change request from the header decompressor unit to the header compressor unit;
wherein the header compressor unit is configured to determine if the mode change request is to be rejected and to send an indication of the node change request rejection towards the header decompressor unit;
wherein the header decompressor unit is configured to perform a rejection acknowledgement action at the header decompressor unit, if the header decompressor unit is aware of the indicated rejection, said rejection acknowledgement action signifying a successful rejection; and wherein the header compressor unit is configured to remain in the first compression mode in response to a successful rejection.

17. The communication system of claim 16, wherein the header compressor unit is configured to signal, implicitly at or explicitly rejection of the mode change request.

18. The communication system of claim 17, wherein the header compression unit is configured to send a mode change rejection message from the header compressor unit to the header decompressor unit.

19. The communication system of claim 18, wherein the mode change rejection message comprises a redefined mode value.

20. The communication system of claim 17, wherein the header compression unit is configured to ignore the mode change request for a predetermined period of time.

21. The communication system of claim 16, wherein the header decompression unit is configured to abort further mode change request transmission in response to the indicated rejection.

22. The communication system of claim 21, wherein the header decompression unit is configured to send a rejection acknowledgement message to the header compressor unit in response to the indicated rejection.

23. The communication system of claim 16, wherein the header compression unit is configured to monitor the packet transfer link to determine, whether the rejection was successful.

24. The communication system of claim 16, wherein the header compressor unit is arranged to support only a subset of all possible compression modes.

25. The communication system of claim 16, wherein at least one of the header compressor unit and the header decompressor unit is implemented according to a robust header compression (ROHC) scheme.

26. The communication system of claim 25, wherein the first and second compression modes are selected from the group of a unidirectional (U) mode, a bidirectional optimistic (O) mode, a bidirectional reliable (R) mode and a bidirectional (B) mode, including combinations thereof.

27. A node of a communications system comprising a header compressor unit for packet data communication structured and arranged, upon receiving, from a header decompressor unit, a mode change request involving a change from a first compression mode in which the header compressor unit is operating to a second compression mode over a packet transfer link, to provide an indication of rejection of the mode change request towards the header decompressor unit;

to interpret the signaling behavior of the header decompressor unit to determine whether the rejection was successful; and to remain in the first compression mode in response to a successful rejection.

28. The header compressor unit of claim 27, wherein the header compressor unit is configured to send a mode change rejection message to the header decompressor unit.

29. The header compressor unit of claim 28, wherein the mode change rejection message comprises a redefined mode value.

30. The header compressor unit of claim 27, wherein the header compressor unit is configured to ignore the mode change request for a predetermined period of time.

31. The header compressor unit of claim 27, wherein the header compressor unit is configured to monitor the packet transfer link.

32. The header compressor unit of claim 27, wherein the header compressor unit is arranged to support only a subset of all possible compression modes.

33. The header compressor unit of claim 27, wherein the header compressor unit is configured to implement a robust header compression (ROHC) scheme with the first and second compression modes selected from the group of a unidirectional (U) mode, a bidirectional optimistic (O) mode, a bidirectional reliable (R) mode and a bidirectional (B) mode, including combinations thereof.

* * * * *

UNITED STATES PATENT AND TRADEMARK OFFICE
CERTIFICATE OF CORRECTION

PATENT NO. : 7,512,716 B2  
APPLICATION NO. : 10/673345  
DATED : March 31, 2009  
INVENTOR(S) : Pelletier et al.

Page 1 of 1

It is certified that error appears in the above-identified patent and that said Letters Patent is hereby corrected as shown below:

In Column 1, Line 66, delete "0-mode" and insert -- O-mode --, therefor.

In Column 2, Line 3, delete "0-mode" and insert -- O-mode --, therefor.

In Column 2, Line 4, delete "U/0-mode" and insert -- U/O-mode --, therefor.

In Column 4, Line 12, delete "ice" and insert -- service --, therefor.

In Column 12, Line 38, in Claim 14, delete "(0)" and insert -- (O) --, therefor.

In Column 12, Line 45-46, in Claim 16, delete "comprising." and insert -- comprising: --, therefor.

In Column 14, Line 2, in Claim 26, delete "(0)" and insert -- (O) --, therefor.

In Column 14, Line 37, in Claim 33, delete "(0)" and insert -- (O) --, therefor.

Signed and Sealed this

Tenth Day of November, 2009

David J. Kappos
*Director of the United States Patent and Trademark Office*